Jan. 30, 1962 A. GAUTHEY 3,019,350

PULSE SEPARATING COUNTER INPUT DEVICE

Filed Oct. 21, 1957 4 Sheets-Sheet 1

INVENTOR
ALBERT GAUTHEY
BY
Marshall M. Truex
ATTORNEY

Jan. 30, 1962 A. GAUTHEY 3,019,350

PULSE SEPARATING COUNTER INPUT DEVICE

Filed Oct. 21, 1957 4 Sheets-Sheet 2

Jan. 30, 1962 A. GAUTHEY 3,019,350

PULSE SEPARATING COUNTER INPUT DEVICE

Filed Oct. 21, 1957 4 Sheets-Sheet 3

United States Patent Office 3,019,350
Patented Jan. 30, 1962

3,019,350

PULSE SEPARATING COUNTER INPUT DEVICE

Albert Gauthey, Paris, France, assignor to IBM France Company, Paris, France, a corporation of France Filed Oct. 21, 1957, Ser. No. 691,485
Claims priority, application France Nov. 13, 1956
11 Claims. (Cl. 307—88.5)

Figure 1A:
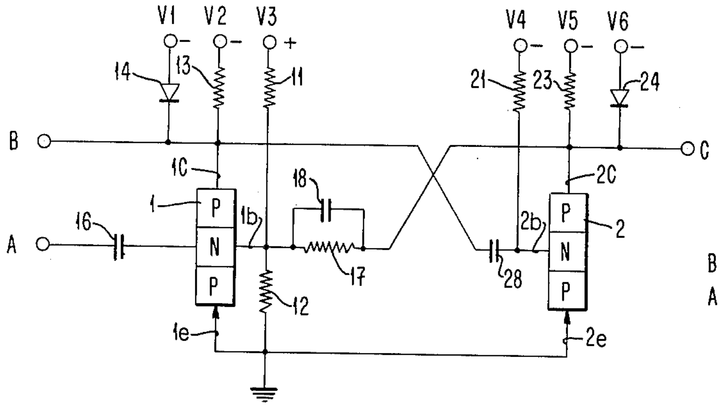

This invention relates to counter control devices and more particularly to pulse counter control devices for counting pulses from various sources.

Generally a pulse counter can only work if pulses provided through a control wire are spaced from one another by a minimum time interval which corresponds to the recovery time required by the counter elements after an operation. Consequently a difficulty is met when it is desired to count random pulses from a number of different sources for, when mixed at the counter input terminal, there may be any time interval between two adjacent pulses, and consequently, less than the minimum time interval required for accurate counter operation; the worst condition occurring when two or more pulses are received simultaneously or overlap each other so that only one pulse would be counted.

A primary object of this invention consists in a pulse counter feed device which receives pulses from a number of sources and provides at one common output, pulses which are spaced by a given minimum time interval, whatever may be the pulse occurrence relative timings at input terminals.

Another object of the invention is the provision of a device capable of receiving two simultaneous or closely adjacent pulses on two different input terminals and delaying one of these pulses to deliver to an output terminal, the two pulses spaced at an interval adequate for properly operating a counter.

Another object of this invention is to provide counter feed device strap circuits between the pulse advance chains so as to lock these chains for a short moment in order to insure the desired interval between various output pulses.

Other objects of the invention will be pointed out in the following description and illustrated in the accompanying drawings, which disclose, by way of example, the principle of the invention and the best mode which has been contemplated of applying that principle.

In the drawings:

FIG. 1*a* is a schematic view of a monostable circuit for furnishing pulses of a given length.

Figure 1B:
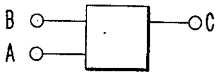

FIG. 1*b* is a diagrammatic view of the circuit of FIGURE 1*a*.

Figures 2A, 2B:
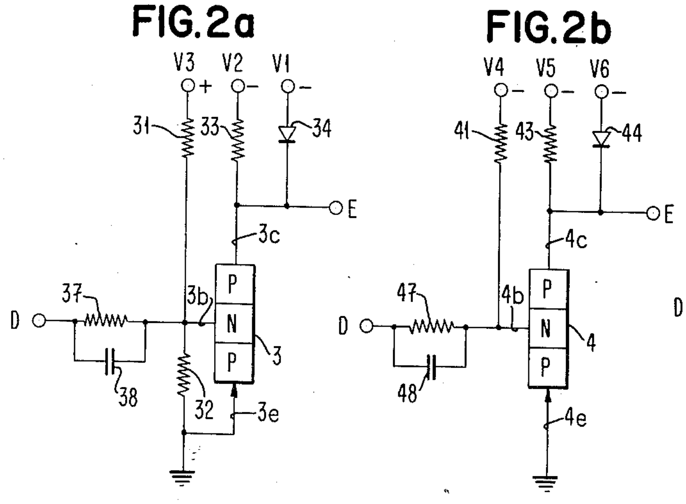

FIG. 2*a* represents schematically a pulse inverter circuit.

FIG. 2*b* is a schematic representation of another pulse inverter circuit.

Figure 2C:
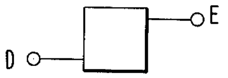

FIG. 2*c* is a diagrammatic view of pulse inverter circuits.

Figure 3A:
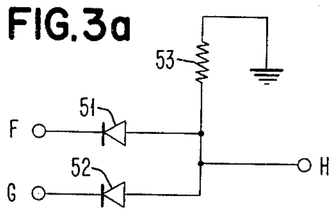

FIG. 3*a* is a schematic view of a logical inclusive "OR" circuit.

Figure 3B:
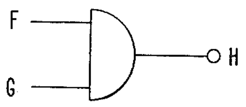

FIG. 3*b* is a diagrammatic view of an inclusive "OR" circuit.

Figure 4:
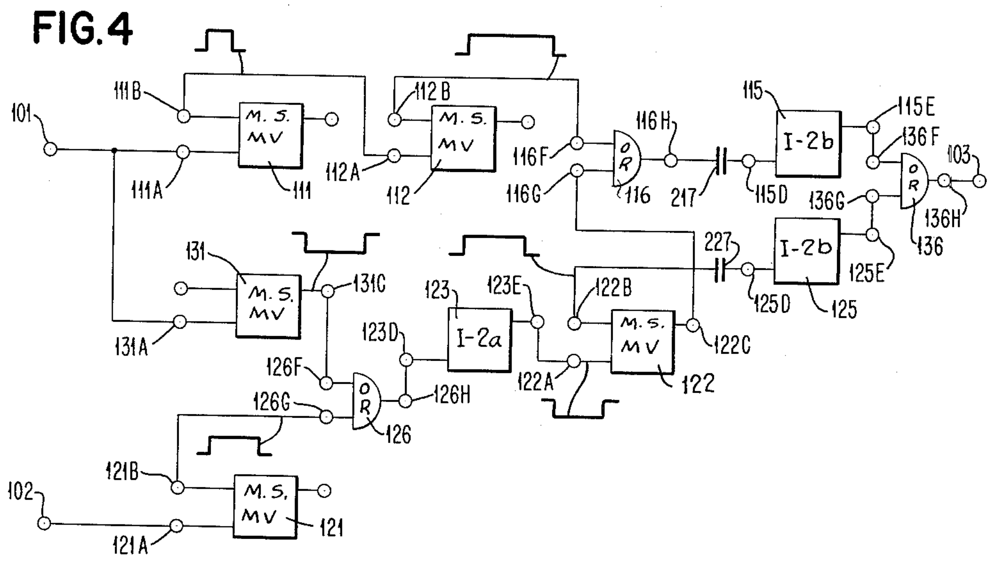

FIG. 4 represents a block diagram of an embodiment of the invention.

FIGS. 5*a* to 5*e* represent in diagrams the pulse production relative timings in various points of the circuit shown in FIGURE 4.

The preferred embodiment of the invention as hereinafter described comprises generally a plurality of monostable multivibrators arranged in a series for each input to pass the input signals to a common output terminal. The series of multivibrators for each input is interconnected with the other series to delay transmission of a pulse in a series while a pulse is passing through the other series and for a short interval thereafter so that the second pulse cannot appear on the output terminal until the associated counter has recovered from the initial pulse. Generally an input pulse will be transmitted to the output terminal with a minimum of delay but when a pulse is passing through the other series and for a predetermined period thereafter, the first series is blocked at an intermediate point of the series until the counter is ready to receive a second pulse.

Referring now to FIGURE 1*a* which represents a monostable circuit, it may be seen that this circuit comprises two transistors 1 and 2. Transistor 2 is normally conducting since its base **2*b* is connected through resistance R21 to negative potential —V4. Consequently, its three electrodes are at ground potential and particularly its collector 2*c*. Then due to resistances R11, R12 and R17, base 1*b* of transistor 1 has then a positive potential, and transistor 1 is locked. Thus, collector 1*c* of transistor 1 has a negative potential because there is no current flow through resistance R13. This negative potential of collector 1*c* is limited by diode 14 to prevent a potential more negative than —V1. Thus, when in the "OFF" state output terminal B is at potential —V1, and output terminal C is at ground potential. If a positive pulse occurs at input terminal A, here is no resulting effect, since transistor 1 having its base 1*b* positive is already non-conducting. If a negative pulse is provided to terminal A, a charge current for capacitor 16 will flow from ground through the emitter-base junction of the transistor, thereby making transistor 1 conducting. Collector 1*c* and terminal B will go to ground potential. At the same time, the potential increase at collector 1*c* produces a positive pulse which is transmitted through capacitor 28 and is effective to terminate conduction in latching transistor 2 and collector 2*c*; consequently, output terminal C goes negative due to no current flowing through resistance 23, and its voltage is limited to potential —V6 by diode 24. The negative potential drop at collector 2*c* produces a negative pulse which charges capacitor 18. So long as collector 2*c* of transistor 2 has a negative potential, base 1*b* of transistor 1 is kept to a negative potential, through resistances R11, R12 and R17. Base 2*b* of transistor 2 which had been given a positive potential by the pulse leading edge transmitted by capacitor C28 now tends to reach potential —V4, with a time constant being determined by capacitor C28 and resistance R21. When base 2*b* reaches ground potential, transistor 2 starts conducting again and the positive potential change at its collector 2*c* is transmitted through capacitor 18 to the base of transistor 1 to turn off transistor 1 and the whole device is reset. Transistor 1 cannot thereafter respond to a second pulse on its input terminal A until the positive change on condenser 18 has decreased to a level which will enable an input pulse to bring the base voltage on line 1*b*** to a negative level.

As a conclusion, a negative leading edge appearing at input terminal A causes terminal B to be brought from potential —V1 to ground potential, and terminal C from ground potential to potential —V6, for a time period which is determined by a circuit which is composed of resistance 21 and capacitor 28.

Referring now to FIGURE 2*a* representing an inverter circuit, it may be seen that transistor 3 may have two states. If terminal D is provided with ground potential, base **3*b* of transistor 3 keeps to a positive potential because of a voltage divider comprising resistances 31** and 32 situated between potential +V3 and ground; consequently, transistor 3 is not conducting and collector 3c is at potential —V1, as in monostable circuit of FIGURE 1a, and thus the output terminal E is at potential—V1. If terminal D is given a negative potential, transistor 3 becomes conductive and its three electrodes, particularly collector 3c, and output terminal E are given ground potential. Due to capacitor C38, the leading edges appearing at terminal D undergo no voltage drop across resistance R37 and the transistor reacts immediately.

The inverter circuit shown in FIGURE 2b is provided for reacting to voltages ranging somewhere between ground and a positive potential. When in the "OFF" state, terminal D is at ground potential and transistor 4 is conductive since its base 4b is at a negative potential due to a voltage divider determined by resistances R41 and R47 between potential —V4 and ground, and collector 4c and thus output terminal E are at ground potential. If a negative pulse reaches terminal D the state of transistor 4 is not changed. But if a positive pulse reaches terminal D, base 4b of transistor 4 is brought to a positive potential and is kept thereunder as long as terminal D is under a positive potential. Meanwhile, transistor 4 is locked, and collector 4c and output terminal E are brought to potential —V6. Capacitor C48 acts in this circuit as did capacitor C38 in preceding circuit.

FIGURE 3a shows an inclusive "OR" circuit wherein output terminal H is at ground potential, unless one at least of the two terminals F or G is brought to a negative potential.

Referring now to FIGURE 4 which represents a block diagram of an embodiment of the invention, it may be seen that the device is an assembly of the preceding circuits. In this figure, blocks referred to as 111, 112, 121, 122, 131, represent monostable circuits corresponding to FIGURE 1b, the internal diagram of which is the same as in FIGURE 1a, block 123 shows an inverter similar to that represented in FIGURE 2c and having the same internal connections as in the 2a diagram, blocks 115 and 125 inverters such as in FIGURE 2c and having the internal connection shown in FIGURE 2b, and blocks 116, 126, 136 inclusive relation circuits or "OR" circuits, such as represented in FIGURE 3b and having internal connection, in FIGURE 3a. So as to make clear the device operation, there will be given in the following description the duration of the pulses provided by monostable devices, but these durations are but illustrative and do not limit the scope of the invention. In the selected example, input pulses are negative, and provided by two independent sources to input terminals 101 and 102. The device provides pulses at output terminal 103. There are several cases to dintinguish according to whether the device receives pulses on one or both input terminals.

*First case*

A negative pulse reaches terminal 101 and no pulse reaches terminal 102.

Monostable circuit 111 delivers a four-microsecond positive-going pulse. The negative-going trailing edge of this pulse energizes monostable circuit 112 via its input terminal 112A, and monostable circuit 112 delivers a 20 microsecond positive-going pulse to its output terminal 112B which is transmitted to "OR" circuit 116. Thus "OR" circuit 116 receives at its terminal 116F a 20 microsecond positive-going pulse which starts 4 microseconds after the arrival of the start pulse at input terminal 101 of the device. At the same time, input terminal 102 receives no pulse, and thus output 121B of monostable circuit 121 is at a negative potential. "OR" circuit 126 having its terminal 126G at a negative potential has always its output 126H at a negative potential and delivers no pulses though receiving some upon terminal 126F through monostable circuit 131. Inverter 123 has input 123D negative and output 123E at ground. Consequently, terminal 122C of monostable circuit 122 is at ground potential since input 122A is at ground. Output 122B is at a negative potential so that output 125E of inverter 125 and input 136G of "OR" circuit 136 are at ground. Since input terminal 116G of "OR" circuit 116 is at ground potential, the positive-going pulse arriving at terminal 116F of "OR" circuit 116 is transmitted to output terminal 116H. Capacitor 217 delivers a positive pulse which is followed by a negative pulse 20 microseconds later. Inverter 115 receiving both pulses on input terminal 115D provides at its output terminal 115E one negative pulse corresponding to the positive pulse, the negative input pulse having no action on such an inverter. This negative pulse is received on terminal 136F of "OR" circuit 136 and is transmitted to "OR" circuit output 136H, since terminal 136G is at ground potential, and, in turn, to the output terminal 103.

Consequently, if a negative pulse reaches input terminal 101 and no pulse reaches input terminal 102, a negative pulse is delivered to output terminal 103 four microseconds after the arrival of the input pulse.

*Second case*

A negative pulse is provided to terminal 102 and none to terminal 101.

The input pulse is transmitted to terminal 121A of monostable circuit 121 which delivers to output terminal 121B a 24 microsecond positive-going pulse which reaches terminal 126G of "OR" circuit 126. As there is no pulse occurring at terminal 101, monostable circuit 131 is kept "OFF" thereby holding terminal 131C at ground potential as well as terminal 126F of "OR" circuit 126. The positive-going pulse appearing at terminal 126G of "OR" circuit 126 is transmitted to terminal 126H. Inverter 123 receives this positive-going pulse upon terminal 123D and transforms it into a 24 microsecond negative-going pulse which appears upon terminal 123E. The negative leading edge of the pulse energizes monostable circuit 122 via terminal 122A to produce a 14 microsecond positive-going pulse at terminal 122B. Inverter 125 cooperating with capacitor 217 produces at the output terminal 125E of inverter 125, a negative-going pulse which corresponds to the positive leading edge of the 14 microsecond pulse which is provided by monostable circuit 112. As no impulse reaches terminal 101, monostable circuits 111 and 112 are kept "OFF" and accordingly output terminal 112B is at a negative potential. Therefore, output terminal 116H of "OR" circuit 116 is always negative, whatever may be the state of input terminal 116G, and inverter 115 receiving no pulse, output terminal 115E and thence terminal 136F is at ground potential. Thus, the negative-going pulse from inverter 125 on terminal 136G of "OR" circuit 136 is transmitted to output terminal 136H, and thence to the device output 103.

Consequently, if a negative pulse arrives at input terminal 102 and if there is none at input terminal 101, a negative pulse is delivered to output terminal 103 simultaneously with the input pulse since it is the leading edge of each developed pulse from monostable circuits 121 and 122 which is effective to produce the output pulse at terminal 103.

*Third case*

A negative pulse reaches each one of input terminals 101 and 102. If pulses are spaced enough, both pulses may be considered as isolated. If they approach each other, time speaking, it is necessary to examine the operation of both straps or latches, one of which is constituted by monostable circuit 131, and the other by monostable circuit 122. Monostable circuit 131 receives a negative pulse 101. This monostable circuit provides to input terminal 126F of "OR" circuit 126 a 16 microsecond negative-going pulse which starts with the arrival of the input pulse which due to "OR" circuit 126, cuts off a portion of the positive-going pulse from monostable circuit 121 which is generated by an input pulse at terminal 102. In the same manner, the 14 microsecond negative-going pulse provided by monostable circuit 122 at terminal 122C and in turn at terminal 116G cuts off a portion of the positive pulse from monostable circuit 112 due to "OR" circuit 116.

Diagrams in FIGURES *5a* to *5e* indicate the relative timings and durations of pulses in various points of the device, the reference numbers for the curves being the same as those for corresponding points in FIGURE 4.

The FIGURE *5a* pulse 502 appears on terminal 102 less than 24 microseconds and more than 12 microseconds after pulse 501, in the selected example. In such a case, before the beginning of the operation initiated by pulse 502, "OR" circuit 116 transmits only portion 508 of the pulse 503 which is produced by monostable circuit 112, a portion which is anterior to the production of pulse 507 in monostable circuit 122. Consequently the leading edges of pulses 503 and 507 which produce output pulses 509 and 510 corresponding to input pulses 501 and 502, respectively, are not modified, and for each input pulse there is an output pulse, as when pulses are single. More specifically, pulse 501 is applied to terminal 101 and produces a positive-going pulse of 4 microseconds duration at terminal 111B. Pulse 501 also is applied to produce a negative-going 16 microsecond pulse 504 at terminal 131C and, in turn, at terminal 126F. For 16 microseconds, the output 126H of "OR" circuit 126 is held negative (506) as a result of its terminal 126F being negative. The trailing edge of the 4 microseconds positive-going pulse applied to terminal 112A triggers monostable circuit 112 causing a positive-going pulse 503 of 20 microseconds duration to be applied to "OR" circuit 116 via terminals 112B and 116F. The condition of monostable circuit 122 must now be examined to determine the state of the input 116G to "OR" circuit 116. As described previously, output terminal 126H of "OR" circuit 126 remains negative (506) for 16 microseconds and the output of inverter 123 is positive for this period. Monostable circuit 122 remains in its quiescent state with terminal 122B negative and terminal 122C positive. Thus, terminal 116G of "OR" circuit 116 is positive (507) and the 20 microsecond pulse 508 from monostable circuit 112 is passed through the "OR" circuit to terminal 116H. This pulse is differentiated and positive and negative resultant pulses are applied to inverter 115 via terminal 115D. Only the positive pulse is effective, and the inverted pulse on terminal 115E is applied to terminal 136F of "OR" circuit 136. Since monostable circuit 122 is quiescent, the output of inverter 125 is positive to condition input 136G of "OR" circuit 136, and the negative pulse from inverter 115 is passed to output terminal 103 as pulse 509. This pulse is displaced in time 4 microseconds from the input pulse 501 applied to terminal 101.

After monostable circuit 131 has returned to its stable state (16 microseconds after the occurrence of the pulse at terminal 101), an input pulse 502 is applied to terminal 102 which triggers monostable circuit 121 to furnish a positive-going pulse 505 of 24 microseconds duration to terminals 121B and 126G. The input 126F to "OR" circuit 126 is now at ground (504) so the pulse 505 is passed to terminal 126H at pulse 506. Pulse 506 is inverted by inverter 123 and the leading edge triggers monostable circuit 122. Terminal 122C goes negative (507) and holds down terminal 116G of "OR" circuit 116; terminal 122B goes positive for 14 microseconds and this signal is differentiated and applied to terminal 125D. The positive result is inverted and furnished to terminal 136G of "OR" circuit 136. Terminal 116G is held negative by pulse 507 as stated above and output terminal 116H is made negative thereby. The output of inverter 115 is at ground so that input 136F of "OR" circuit 136 is conditioned to pass the pulse 510 on terminal 136G to output terminal 103.

In FIGURE *5b*, pulse 512 is applied to terminal 102 less than 12 microseconds after pulse 510 reaches terminal 101, in the selected example. In such a case, "OR" circuit 126 transmits only the portion 516 of pulse 515 produced by monostable circuit 121 which is posterior to the end of pulse 514 produced by monostable circuit 131, and "OR" circuit 116 transmits only the portion 518 of pulse 513 produced by monostable circuit 112, which is anterior to the beginning of pulse 517 produced by monostable circuit 122 which is energized by the negative leading edge of a negative pulse resulting from inverter 123 reacting upon pulse 516.

Therefore to input pulse 510 corresponds output pulse 519 which as it is produced by the positive leading edge of pulse 513, is not changed by pulse 512. On the contrary, pulse 520 which results from pulse 512 through the leading edge of pulse 516, is delayed until the end of pulse 514, which causes it to appear 12 microseconds after pulse 519. Pulse 510 is applied at terminal 101 and triggers monostable circuits 111 and 131. Monostable circuit 112 produces a 20 microsecond positive-going pulse 513 delayed 4 microseconds from pulse 510 at input 116F of "OR" circuit 116. Pulse 514 developed by monostable circuit 131 holds down the output of 123D of "OR" circuit 126 for 16 microseconds. Pulse 512 is applied at terminal 102 during the 16 microseconds that "OR" circuit 126 is being conditioned by pulse 514 and triggers monostable circuit 121 which provides a 24 microsecond positive-going pulse 513 to terminal 126G. The output of "OR" circuit 126 does not rise until the monostable circuit 131 becomes quiescent when pulse 516 is generated (this is the posterior portion, in effect, of pulse 515). Pulse 516 is inverted and the negative leading edge triggers monostable circuit 122, the latter providing a 14 microsecond positive-going pulse at terminal 122B and a 14 microsecond negative-going signal 517 at terminal 122C. The pulse 517 effectively chops off the latter portion of pulse 513 furnished by monostable circuit 112 so that positive-going pulse 518 appears at terminal 116H. This pulse 518 is differentiated and the positive pulse is inverted and applied to terminal 136F of "OR" circuit 136. As shown in FIG. *5b*, the monostable circuit 122 is quiescent throughout the duration of pulse 518 so the output of inverter 125 conditions input 136G of "OR" circuit 136 for passage of pulse 519 to output terminal 103. The positive-going 14 microsecond pulse at terminal 122B is differentiated and the resultant positive signal is inverted by I–*2b* and applied to input 136G of "OR" circuit 136. Terminal 136F is at ground except for the time when pulse 519 is passed and, thus, pulse 520 is transmitted to output terminal 103. Summarizing, pulse 520 is displaced from pulse 519 by the 16 microseconds (M.S.MV 131) less 4 microseconds (M.S.MV 111)—a difference of 12 microseconds.

In FIGURE *5c*, pulse 522 arriving at input terminal 102 occurs less than 8 microseconds before pulse 521 which arrives at input terminal 101, for the selected example. In such a case, "OR" circuit 126 transmits portions 526*a* and 526*b* of pulse 525 produced by monostable circuit 121, which are respectively anterior and posterior to pulse 524 produced by monostable circuit 131. The positive leading edge of pulse 526*a* (which is reversed by inverter 123) causes monostable circuit 122 to produce pulse 527. The leading edge of pulse 526*b* is ineffective because the monostable circuit is such as can react only if there is a long enough time between the end of the pulse produced by this circuit and the arrival of a new energizing pulse (this time is so much the longer as the value of capacitor 18 in FIGURE *1a* is greater).

Moreover "OR" circuit 116 transmits only the portion of pulse 523 produced by monostable circuit 112 which occurs after the end of pulse 527 and under these conditions output pulses 529 and 530 corresponding to input pulses 521 and 522 respectively appear at the end and at the beginning of pulse 527, and thus are spaced by a time interval which is equal to this pulse duration. Briefly, in FIGURE 5*c*, pulse 522 triggers monostable circuit 121 to furnish a 24 microsecond positive-going pulse 525 at terminal 126G. Pulse 521 triggers monostable circuit 131 to provide a 16 microsecond negative-going signal 524. Since the output 126H can only be at ground when the inputs are at ground, pulse 526*a* is formed having a duration equal to the spacing between pulses 522 and 521. Pulse 526*b* is also formed at terminal 126H but is, in effect, ignored as explained above regarding recovery time. Input 116F is conditioned as explained before, and the return of monostable circuit 122 to its stable state places terminal 116G at ground (527) so that pulse 528 is formed from pulse 523 (being the posterior portion thereof). Pulse 528 is differentiated and the positive signal selected, inverted and passed to output terminal 103.

Figure 5A:
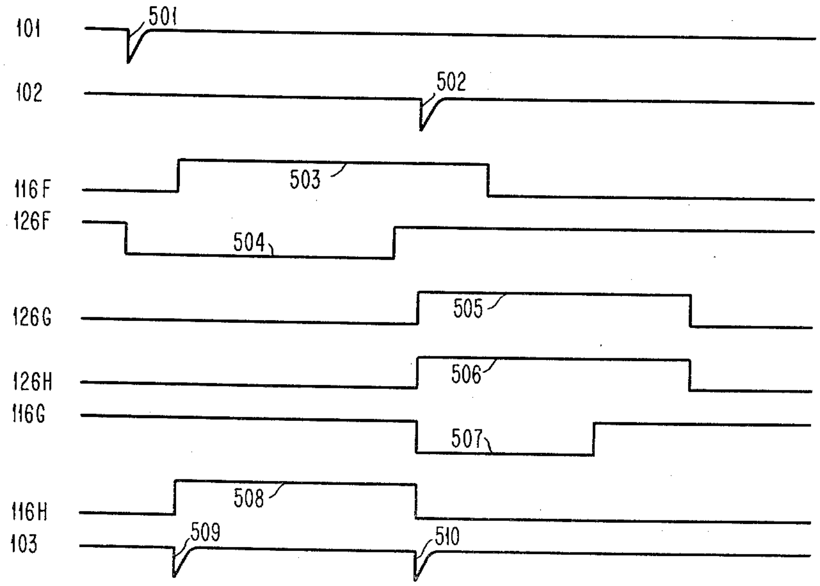
Figure 5B:
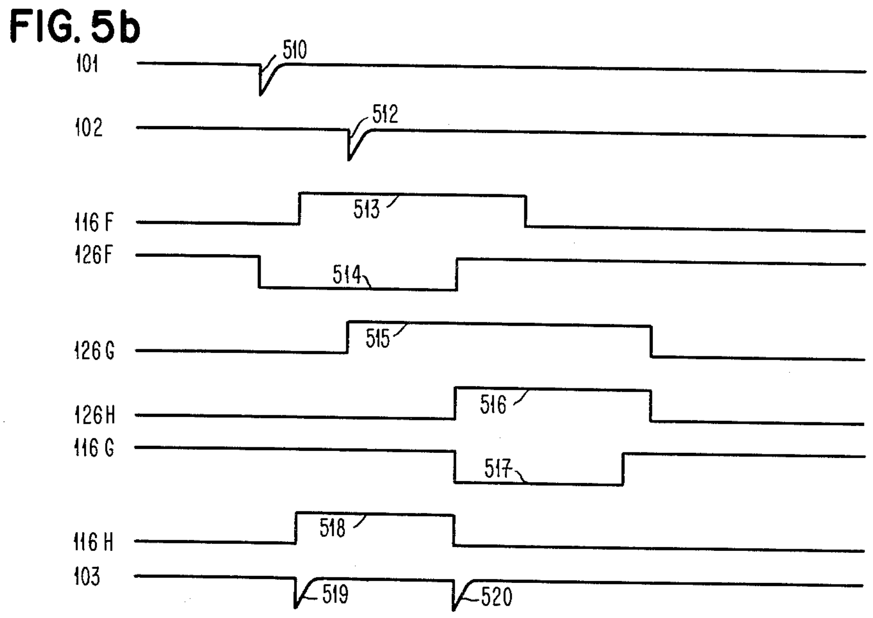
Figure 5C:
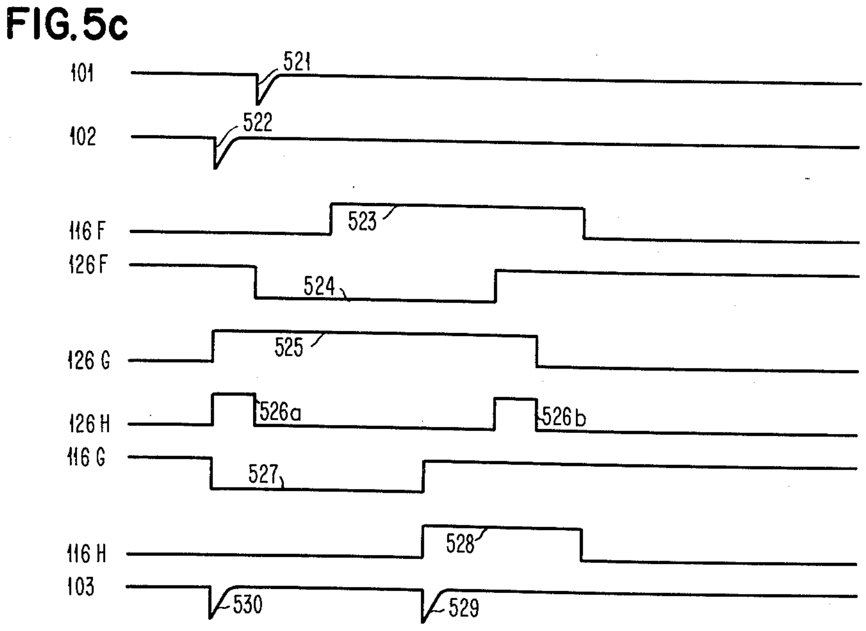
Figure 5D:
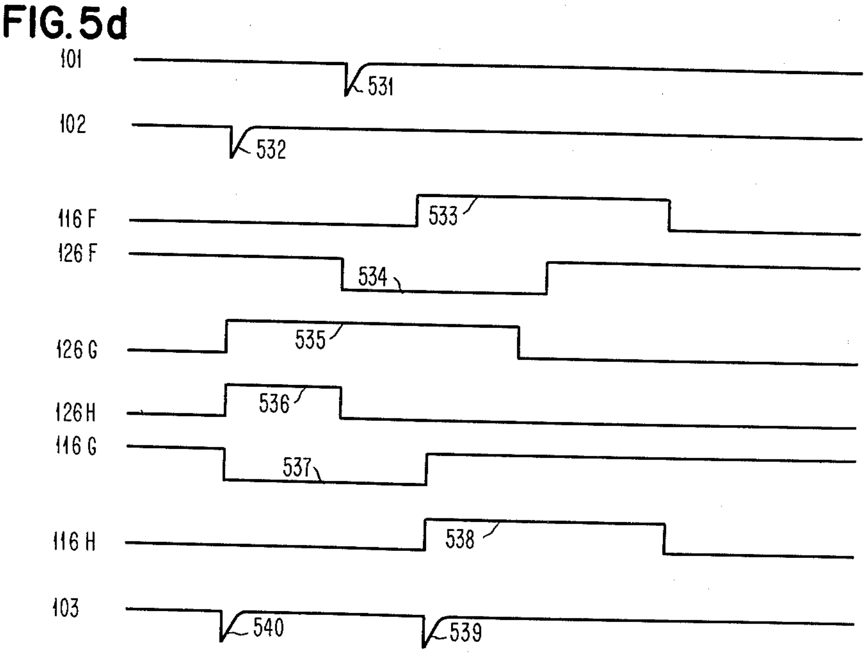

FIGURE 5*d* shows a diagram wherein pulse 531 at terminal 101 occurs after pulse 532 at terminal 102, more than 8 and less than 10 microseconds after, in the herein described example. Things happen just as it did in FIGURE 5*c* except that "OR" circuit 126 transmits only the portion 536 of pulse 535 produced by monostable circuit 121 which occurs before pulse 534 is produced by monostable circuit 131. Output pulses 539 and 540 corresponding to input pulses 531 and 532 respectively, occur at the end and at the beginning of pulse 537 produced by monostable circuit 122. This happens so long as input pulses are near enough one to another to cause pulses 537 and 533, produced by monostable circuits 122 and 112 respectively, to be overlapped one with the other.

Figure 5E:
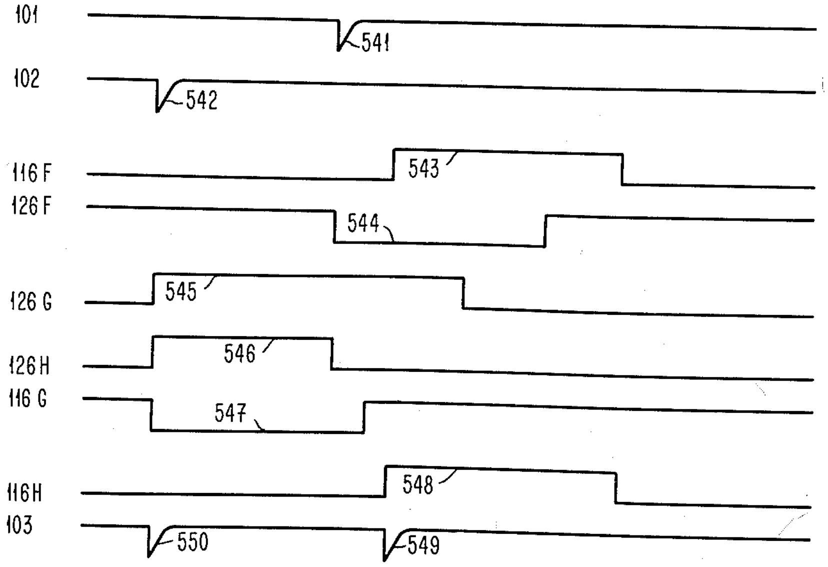

FIGURE 5*e* shows a diagram in which pulse 541 at terminal 101 appears more than 10 microseconds after pulse 542 at terminal 102, in described example. In such a case "OR" circuit 126 transmits only the portion 546 of pulse 545 produced by monostable circuit 121 which occurs before pulse 544 is produced by monostable circuit 131 and "OR" circuit 116 transmits the whole 548 of pulse 543 produced by monostable circuit 112. As output pulses 549 and 550 corresponding to input pulses 541 and 542 respectively are produced by leading edges of pulses 548 and 547, the output pulses occur as if the pulses would appear one by one except for the four microsecond delay of pulse 541 reflected in pulse 549.

In all these diagrams, it may be seen that the pulse produced by monostable circuit 112 is 4 microseconds late with respect to the input pulse at terminal 101, and this delay is due to monostable circuit 111. If there were no such delay when pulses appearing at terminals 101 and 102 are coinciding "OR" circuit 116 would receive the leading edge of the pulse from monostable circuit 112 slightly before the pulse from monostable circuit 122 since the latter is not energized directly by the input pulse at terminal 102. Such is the case in FIGURE 5*c*, if a very fine pulse 526*a* is applied, and "OR" circuit 116 would give two pulses, one for the beginning of pulse 523, and the other for the end of pulse 527, instead of a single one. Monostable circuit 111 prevents this by delaying pulse 523.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A counter input device comprising a first input terminal, a second input terminal, an output terminal, a first switch normally closed, a pulse delay and pulse lengthening device connected between said first input terminal and said first switch, a second switch normally closed, a pulse lengthening device connected between said second input terminal and said second switch, means effective to open said second switch for a predetermined time in response to a pulse at said first input terminal, means effective to open said first switch in response to a pulse from said second switch and for the duration of said signal therefrom, means effective to provide a signal at the output terminal for each pulse from said first switch, and means effective to provide a signal at the output terminal for each pulse from said second switch.

2. A counter input device comprising a first input terminal, a second input terminal, an output terminal, a first switch normally closed, means generating a delayed pulse of predetermined duration in response to a signal at said first input terminal coupling said first input terminal to said first switch, a second switch normally closed, means generating a pulse of predetermined duration in response to a signal at said second input terminal coupling said second input terminal and said second switch, means effective to open said second switch for a predetermined time in response to a pulse at said first input terminal, means effective to open said first switch in response to a pulse from said second switch for the duration of said signal therefrom, and means effective to provide a signal at the output terminal for each pulse from said first switch and for each pulse from said second switch.

3. A device for receiving pulses from at least two sources and providing pulses at a common output spaced by minimum time interval, comprising, in combination, a first data channel connected to a first of said two signal sources comprising means for delaying and lengthening a pulse, and a switch operable to be opened and closed and normally in a closed condition; a second data channel comprising means for lengthening a pulse and a switch operable to be opened and closed and normally in a closed condition; means providing data pulses to said first and second data channels respectively; means actuated by a pulse at said first data channel for opening the switch in said second data channel and for closing the same after a predetermined time interval; means actuated by a pulse from said switch in said second data channel for opening the switch in said first data channel for the duration of said actuating pulse; and means providing output signals in response to signals from said data channels at said common output.

4. A device for receiving pulses from at least two sources and providing common output pulses spaced by a minimum time interval, a first monostable multivibrator for producing an output pulse of predetermined duration in response to a pulse of the first of said sources, a second monostable multivibrator for producing an output pulse of predetermined duration in response to the termination of the output pulse in said first multivibrator, a first gate circuit, a third monostable multivibrator for producing an output pulse of predetermined duration in response to individual pulses from the second of said sources, means coupling the output of said third multivibrator to said first gate circuit, a fourth monostable multivibrator normally conditioning said first gate circuit for the passage of pulses from said third multivibrator and effective when actuated by a pulse from the first of said sources to block said first gate circuit for a predetermined time interval, a second gate circuit, means coupling the second multivibrator to said second gate circuit, means including a fifth monostable multivibrator for normally conditioning said second gate circuit for the passage of pulses from said second multivibrator and effective when actuated by a pulse from said first gate to provide an output pulse and a pulse blocking said second gate circuit for the time duration of the actuating pulse, an output terminal, means actuated by said second gate circuit for providing a pulse corresponding to the pulse from the first of said sources at said output terminal, and means actuated by said output pulse from said fifth multivibrator for producing a pulse corresponding to the pulse from the second of said sources at said output terminal.

5. A claim in accordance with claim 4 wherein said means actuated by said second gate circuit for providing a pulse corresponding to the pulse from the first of said sources at said output terminal comprises a differentiating circuit for providing first and second output pulses in response to an input pulse, a circuit for discriminating against the second of said output pulses, and one output of an OR circuit coupling said discriminating circuit to said output.

6. A claim in accordance with claim 5 wherein said means actuated by said output pulse from said fifth multivibrator for providing a pulse corresponding to the pulse of the second of said sources at said output terminal comprises a differentiating circuit for providing first and second output pulses in response to an input pulse, a discriminating circuit for discriminating against the second of said output pulses, and another input of said OR circuit coupling said discriminating circuit to said output.

7. A device for receiving pulses from two sources and providing pulses spaced by a minimum time interval at a common output comprising, in combination, a first data channel connected to the first pulse source comprising means for generating a delayed pulse of predetermined duration when energized by a pulse from said first source, a normally closed switch in tandem with said pulse generating means and operable to be opened and closed, a second data channel connected to the second pulse source, comprising a first means for generating a pulse of predetermined duration in response to a pulse from said second source, a normally closed switch in tandem with said pulse generating means and operable to be opened and closed, second means for generating an output pulse when actuated by a signal from said switch and effective when actuated to open said switch in said first data channel for a predetermined time, means responsive to a pulse from said first pulse source to open said switch in said second data channel for a predetermined time, an output terminal, means providing an output pulse at said terminal in response to a pulse from said first data channel including a differentiating circuit for providing first and second signals in response to said pulse from said first data channel, a discriminating circuit for discriminating against the second of said differentiated pulses, and means providing an output pulse to said terminal in response to a pulse from said second data channel including a pulse differentiating circuit for providing first and second signals in response to said pulse from said second data channel and a discriminating circuit for discriminating against the second of said differentiated pulses.

8. A device for receiving pulses from two sources and providing output pulses spaced by a minimum time interval at a common output comprising, in combination, a first data channel connected to the first pulse source comprising means for generating a delayed pulse of predetermined duration when energized by a pulse from said first source, a switch normally closed in tandem with said pulse generating means, and operable to be opened and closed, a second data channel connected to the second pulse source comprising first means for generating a pulse of predetermined duration in response to a pulse to said second source, a switch normally closed in tandem with said pulse generating means and operable to be opened and closed, second means for generating an output pulse when actuated by a signal from said switch in said second data channel and effective when actuated to open said switch in said first data channel for a predetermined time, means responsive to a pulse from said first pulse source to open said switch of said second data channel for a predetermined time, an output terminal, means for providing an output pulse at said terminal in response to the pulse from said first data channel, and means providing an output pulse at said terminal in response to the pulse from said second data channel.

9. A device for receiving pulses from at least two sources and providing output pulses spaced by minimum time intervals, at a common output, a first monostable multivibrator for producing an output pulse of predetermined duration in response to a pulse from the first of said sources, a second monostable multivibrator for producing an output pulse of predetermined duration in response to the termination of the output pulse from said first multivibrator, a third monostable multivibrator for producing an output pulse of predetermined duration in response to individual pulses from the second of said sources, a first gate circuit, means coupling the output of said third multivibrator to the first of said gate circuits, a fourth monostable multivibrator normally conditioning said first gate circuit for the passage of pulses from said third multivibrator and effective when actuated by a pulse from a first of said sources to block said first gate circuit for a predetermined time interval, a second gate circuit, means coupling the output of said second multivibrator to said second gate circuit, means including a fifth monostable multivibrator for normally conditioning said second gate circuit for the passage of pulses from said second multivibrator and effective when actuated by a pulse from said first gate circuit to provide an output pulse for blocking said second gate circuit for the time of the duration of the actuating pulse, an output terminal, a differentiating circuit connected to the output of said second gate circuit, a clipping circuit for clipping a second output pulse from said differentiating circuit, an OR circuit having two inputs and an output, means coupling said clipper circuit to one of the inputs of said OR circuit, means coupling the output of said OR circuit to said output terminal, a second differentiating circuit, means coupling the output pulse from said fifth multivibrator to said differentiating circuit, a clipper for clipping a second of the pulses from said differentiating circuit, the output of the clipping circuit is coupled to the other of said inputs to said OR circuit.

10. A counter input device comprising a first source of input signals, a first device connected to said first source of signals for generating a pulse of predetermined duration for each of said signals, a second device connected to said first device for generating a pulse of predetermined time duration at the termination of the input pulse, a first switch, normally closed, connected to the output of said second device, a second source of signals, a third device connected to said second source of pulses for generating a pulse of predetermined duration in response to each input signal, a second switch normally closed connected to the output of said third device, means effective to open said second switch for a predetermined time in response to a signal from said first source of pulses, means effective to open said first switch in response to a pulse from said second switch and for the duration of said signal therefrom, an output terminal, means effective to provide a signal at said output terminal for each pulse from said first switch associated with the signal from said first source, and means effective to provide a signal to said output terminal for each pulse from said second switch associated with a signal from said second source.

11. A device for receiving pulses from two sources and providing output pulses displaced by a minimum time interval at a common output comprising, in combination, first channel means connected to the first pulse source, comprising a delay circuit and a pulse generating circuit for providing a delayed pulse of a predetermined duration in response to a pulse from said first source, a first switch normally closed in series with said pulse generating circuit and operable to be opened and closed, second channel means connected to said second pulse source including a first pulse generating circuit for generating a pulse of predetermined duration in response to a pulse from said second source, a second switch normally closed in series with said pulse generating means and operable to be opened and closed, a second pulse generating circuit for generating an output pulse when actuated by a signal through said second switch and effective when actuated to open said switch in said first data channel for a predetermined time, means responsive to a pulse from said first source to open said second switch in said second channel for a predetermined time interval, an output terminal, means providing an output signal at said terminal in response to the pulse from said first channel means, and means providing an output signal at said terminal in response to the pulse from said second channel means.

References Cited in the file of this patent

UNITED STATES PATENTS

| | | |
|---|---|---|
| 2,493,648 | Watton et al. | Jan. 3, 1950 |
| 2,552,968 | Hochwald | May 15, 1951 |
| 2,602,140 | Fink | July 1, 1952 |
| 2,611,536 | Barrow | Sept. 23, 1952 |
| 2,673,293 | Eckert | Mar. 23, 1954 |
| 2,692,343 | Spirio | Oct. 19, 1954 |